United States Patent
Lee

(10) Patent No.: US 8,050,073 B2
(45) Date of Patent: Nov. 1, 2011

(54) SEMICONDUCTOR MEMORY DEVICE

(75) Inventor: Jung-Hwa Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 129 days.

(21) Appl. No.: 12/577,816

(22) Filed: Oct. 13, 2009

(65) Prior Publication Data

US 2010/0091589 A1     Apr. 15, 2010

(30) Foreign Application Priority Data

Oct. 15, 2008   (KR) .................. 10-2008-0101196

(51) Int. Cl.
   *G11C 5/06*   (2006.01)
   *G11C 7/00*   (2006.01)
   *G11C 8/00*   (2006.01)

(52) U.S. Cl. .......... 365/63; 365/203; 365/205; 365/207; 365/208; 365/230.03; 365/230.06

(58) Field of Classification Search ................ 365/63, 365/203, 205, 207, 208, 230.03, 230.06
See application file for complete search history.

(56) References Cited

U.S. PATENT DOCUMENTS

| | | | | |
|---|---|---|---|---|
| 5,513,142 A * | 4/1996 | Arimoto et al. | ........ | 365/230.06 |
| 5,555,523 A * | 9/1996 | Haga et al. | ........ | 365/203 |
| 5,631,872 A * | 5/1997 | Naritake et al. | ........ | 365/230.03 |
| 5,654,912 A * | 8/1997 | Hasegawa et al. | ........ | 365/230.03 |
| 5,841,716 A * | 11/1998 | Iwaki | ........ | 365/203 |
| 6,049,499 A * | 4/2000 | Sukegawa et al. | ........ | 365/63 |
| 6,097,648 A * | 8/2000 | Bessho et al. | ........ | 365/203 |
| 6,130,852 A * | 10/2000 | Ohtani et al. | ........ | 365/230.03 |
| 6,188,631 B1 * | 2/2001 | Lee et al. | ........ | 365/230.03 |
| 6,205,068 B1 * | 3/2001 | Yoon | ........ | 365/203 |
| 6,317,373 B1 * | 11/2001 | Tanimura | ........ | 365/230.03 |
| 6,333,869 B1 * | 12/2001 | Tanizaki et al. | ........ | 365/63 |
| 6,442,078 B1 * | 8/2002 | Arimoto | ........ | 365/230.03 |
| 6,816,416 B2 * | 11/2004 | Won | ........ | 365/63 |
| 7,009,899 B2 * | 3/2006 | Lee | ........ | 365/203 |
| 7,082,072 B2 * | 7/2006 | Dono et al. | ........ | 365/230.03 |
| 7,266,037 B2 * | 9/2007 | Mochida | ........ | 365/230.03 |
| 7,333,378 B2 * | 2/2008 | Sim | ........ | 365/203 |

(Continued)

FOREIGN PATENT DOCUMENTS

KR    1020020096411 A    12/2002

(Continued)

*Primary Examiner* — Trong Phan
(74) *Attorney, Agent, or Firm* — Volentine & Whitt, PLLC

(57) ABSTRACT

A semiconductor memory device includes a memory block having first and second word lines extending in a first direction and bit lines extending in a perpendicular second direction; a first driver region at a side of the memory block in the first direction driving the first word lines; a second driver region at another side of the memory block in the first direction driving the second word lines; a sensing region at a side of the memory block in the second direction controlling the bit lines responsive to signals from drive lines; a first conjunction region at an intersection of the first driver and sensing regions including a first driver driving the drive lines responsive to signals from control lines; and a second conjunction region at an intersection of the second driver and sensing regions, including a second driver driving the drive lines responsive to signals from the control lines.

13 Claims, 5 Drawing Sheets

U.S. PATENT DOCUMENTS

| | | | | |
|---|---|---|---|---|
| 7,447,088 B2 * | 11/2008 | Yi | ............................. | 365/230.03 |
| 7,606,087 B2 * | 10/2009 | Lee | ............................... | 365/205 |
| 7,852,702 B2 * | 12/2010 | Uetake | ..................... | 365/230.06 |
| 7,414,874 B2 * | 8/2008 | Fujisawa et al. | ......... | 365/230.03 |
| 7,426,129 B2 * | 9/2008 | Choi et al. | ...................... | 365/63 |

FOREIGN PATENT DOCUMENTS

| | | |
|---|---|---|
| KR | 1020030002985 A | 1/2003 |
| KR | 100704039 B1 | 3/2007 |
| KR | 100827694 B1 | 4/2008 |

* cited by examiner

SEMICONDUCTOR MEMORY DEVICE

CROSS-REFERENCE TO RELATED APPLICATIONS

A claim of priority under 35 U.S.C. §119 is made to Korean Patent Application No. 10-2008-101196, filed on Oct. 15, 2008, the entirety of which is incorporated herein by reference.

BACKGROUND

The inventive concepts described herein are generally related to semiconductor memory devices, and more particularly, to a semiconductor memory device in which a word line is driven in the same direction as a sense amplifier control signal line.

Semiconductor memory devices are basically equipped with sensing circuits for detecting and amplifying data transferred through bit lines. If a word line is selectively activated, data of memory cells coupled to the selected word line are transferred to the sensing circuit by way of bit lines. The sensing circuit detects and amplifies the data transferred through the bit lines, and outputs the detected and amplified data. The sensing circuit may include an equalizer, an NMOS sense amplifier, and a PMOS sense amplifier, each of which is operable in response to signals transferred to drive signal lines arranged in a word line direction.

SUMMARY

Example embodiments of the inventive concept are generally related to providing a semiconductor memory device in which word lines are driven in the same direction as drive signal lines. In an embodiment of the inventive concept, a semiconductor memory device may include a sub memory cell array block having memory cells connected between first and second word lines extending in a first direction and bit lines extending in a second direction perpendicular to the first direction; a first word line driver region disposed at a side of the sub memory cell array block in the first direction, and configured to drive the first word lines; a second word line driver region disposed at another side of the sub memory cell array block in the first direction, and configured to drive the second word lines; a sensing region disposed at a side of the sub memory cell array block in the second direction, and configured to control the bit lines in response to signals transferred through drive signal lines; a first conjunction region disposed at an intersection of the first word line driver region and the sensing region and including a first drive signal driver configured to drive the drive signal lines in response to signals transferred through control signal lines when the first word line driver region drives the first word lines; and a second conjunction region disposed at an intersection of the second word line driver region and the sensing region and including a second drive signal driver configured to drive the drive signal lines in response to signals transferred through the control signal lines when the second word line driver region drives the second word lines.

In an embodiment of the inventive concept, the sensing region may include an equalizer configured to precharge the bit lines in response to the signals transferred through the drive signal lines.

In an embodiment of the inventive concept, the control signal lines may include an equalizer control signal line through which an equalizer control signal is transferred; a first row address information signal line through which a first row address information signal is transferred, the first row address information signal is set to a second state when a lowest row address information is in a first state and is set to the first state when the lowest row address information is in the second state; and a second row address information signal line through which a second row address information signal is transferred, the second row address information signal is set to the first state when the lowest row address information is in the first state and is set to the second state when the lowest row address information is in the second state, wherein the first drive signal driver comprises includes a first drive circuit connected between the equalizer control signal line and a corresponding one of the drive signal lines, and configured to invert the equalizer control signal and output an inverted equalizer control signal; and a first switch circuit connected between the first drive circuit, a power source voltage, and a ground voltage, and switched on/off in response to the first row address information signal, and wherein the second drive signal driver includes a second drive circuit connected between the equalizer control signal line and the corresponding one of the drive signal lines, and configured to invert the equalizer control signal and output the inverted equalizer control signal; and a second switch circuit connected between the second drive circuit, the power source voltage, and the ground voltage, and switched on/off in response to the second row address information signal.

In an embodiment of the inventive concept, the sensing region may include an NMOS drive circuit connected to a ground voltage and turned on/off in response to a signal transferred through a corresponding one of the drive signal lines; and an NMOS sense amplifier connected to the NMOS drive circuit and configured to amplify a voltage of corresponding ones of the bit lines to a level of the ground voltage according to data transferred through the corresponding ones of the bit lines.

In an embodiment of the inventive concept, the control signal lines may include an NMOS enable signal line through which an NMOS enable signal is transferred; a first row address information signal line through which a first row address information signal is transferred, the first row address information signal is set to a second state when a lowest row address information is in a first state and is set to the first state when the lowest row address information is in the second state; and a second row address information signal line through which a second row address information signal is transferred, the second row address information signal is set to the first state when the lowest row address information is in the first state and is set to the second state when the lowest row address information is in the second state, wherein the first drive signal driver includes a first drive circuit connected between the NMOS enable signal line and a corresponding one of the drive signal lines, and configured to invert the NMOS enable signal and output an inverted NMOS enable signal; and a first switch circuit connected between the first drive circuit, a power source voltage, and the ground voltage, and switched on/off in response to the first row address information signal, and wherein the second drive signal driver includes a second drive circuit connected between the NMOS enable signal line and the corresponding one of the drive signal lines, and configured to invert the NMOS enable signal and output the inverted NMOS enable signal; and a second switch circuit connected between the second drive circuit, the power source voltage, and the ground voltage, and switched on/off in response to the second row address information signal.

In an embodiment of the inventive concept, the sensing region may include a PMOS drive circuit connected to a power source voltage and turned on/off in response to a signal transferred through a corresponding one of the drive signal lines; and a PMOS sense amplifier connected to the PMOS drive circuit and configured to amplify a voltage of corresponding ones of the bit lines to a level of the power source voltage according to data transferred through the corresponding ones of the bit lines.

In an embodiment of the inventive concept, the control signal lines may include a PMOS enable signal line through which a PMOS enable signal is transferred; a first row address information signal line through which a first row address information signal is transferred, the first row address information signal is set to a second state when a lowest row address information is in a first state and is set to the first state when the lowest row address information is in the second state; and a second row address information signal line through which a second row address information signal is transferred, the second row address information signal is set to the first state when the lowest row address information is in the first state and is set to the second state when the lowest row address information is in the second state, wherein the first drive signal driver includes a first drive circuit connected between the PMOS enable signal line and a corresponding one of the drive signal lines, and configured to invert the PMOS enable signal and output an inverted PMOS enable signal; and a first switch circuit connected between the first drive circuit, the power source voltage, and a ground voltage, and switched on/off in response to the first row address information signal, and wherein the second drive signal driver includes a second drive circuit connected between the PMOS enable signal line and the corresponding one of the drive signal lines, and configured to invert the PMOS enable signal and output the inverted PMOS enable signal; and a second switch circuit connected between the second drive circuit, the power source voltage, and the ground voltage, and switched on/off in response to the second row address information signal.

According to these embodiments, the drive signal lines may be a same material as the first and second word lines.

According to these embodiments, in the first word line driver region, a corresponding one of the first word lines may be strapped with a main word line corresponding to a row address with a lowest row address information that is in a first state, and in the second word line driver region, a corresponding one of the second word lines may be strapped with another main word line corresponding to a row address with the lowest row address information that is in a second state. Meanwhile, the first word line driver region may include a first sub word line driver configured to drive a corresponding one of the first word lines in response to signals transferred through a main word line and a word line selection signal line when a lowest row address information is in a first state, and the second word line driver region may include a second sub word line driver configured to drive a corresponding one of the second word lines in response to signals transferred through the main word line and another word line selection signal line when the lowest row address information is in a second state.

BRIEF DESCRIPTION OF THE DRAWINGS

Example embodiments are described in detail below with reference to the accompanying drawings to provide a further understanding, and wherein.

DETAILED DESCRIPTION OF THE EMBODIMENTS

Figure 1:
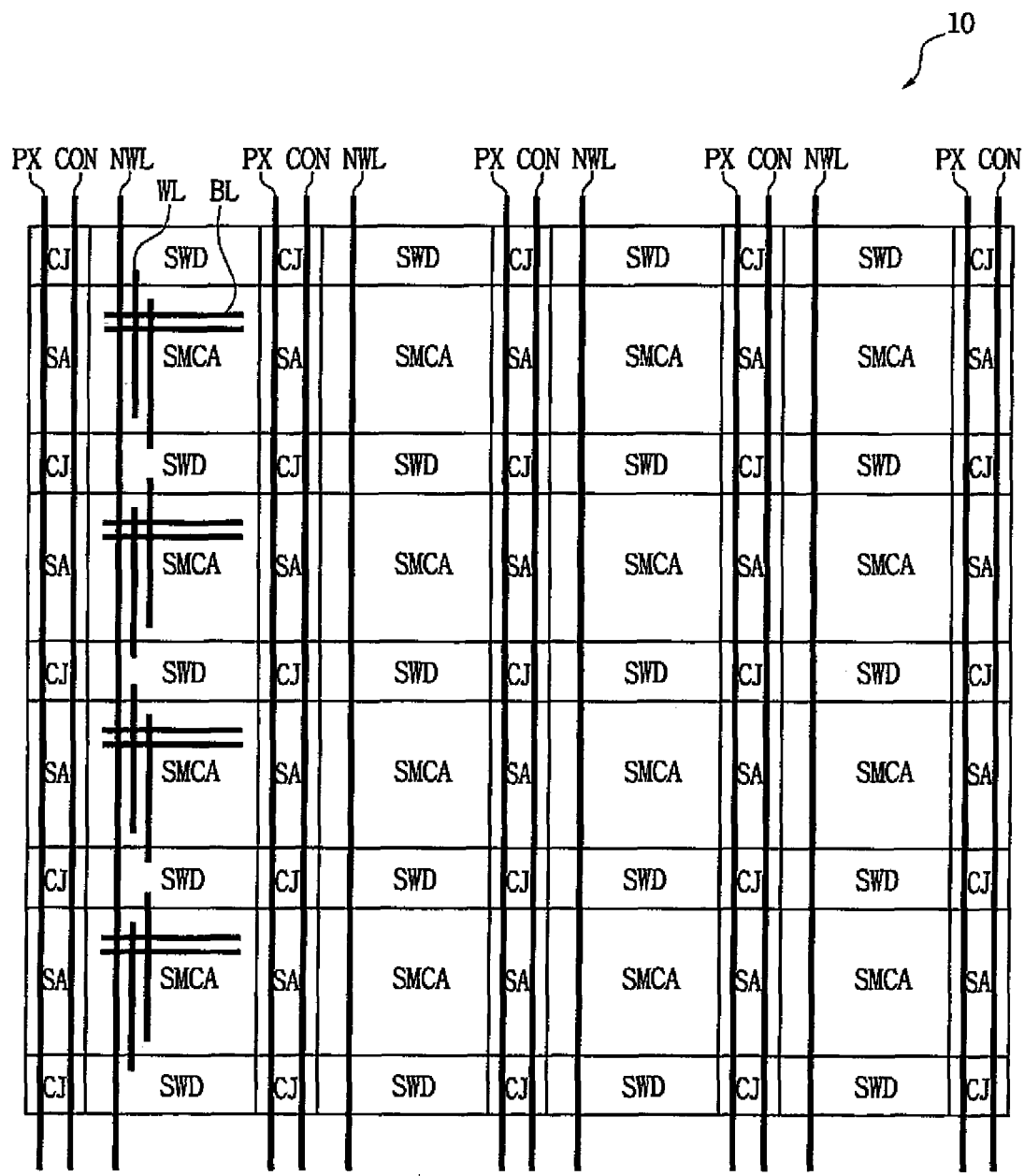
FIG. 1 is a diagram illustrating a configuration of a semiconductor memory device according to an embodiment of the inventive concept.

Various example embodiments will now be described more fully with reference to the accompanying drawings. Specific structural and functional details disclosed below are only examples chosen to describe the example embodiments. The inventive concept may be embodied in many alternate forms and should not be construed as limited to the example embodiments set forth herein. Like reference numerals refer to like elements throughout the drawings. Also, it should be understood that various aspects of the drawings may have been exaggerated for clarity.

It will be understood that, although terms such as "first" and "second" may be used herein to distinguish one element from another, these terms are not limiting. For example, a first element could be termed a second element and vice versa without any change in structure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

All terminology used herein is intended to describe particular example embodiments only, and should not be construed as limiting the scope of the inventive concept. Use of the singular form to refer to an element, such as "an element" or "the element", does not exclude the possibility of there being a plurality of said elements, unless the context clearly indicates otherwise. It will be further understood that the terms "comprise" and "include" specify the presence of stated features, numbers, steps, operations, elements and/or components, and do not preclude the presence or addition of one or more other features, numbers, steps, operations, elements, components and/or groups thereof.

FIG. 1 is a diagram illustrating a configuration of a semiconductor memory device according to an embodiment of the inventive concept. In FIG. 1, a memory cell array 10 includes conjunction region CJ, sub word line driver regions SWD, sub memory cell array blocks SMCA, and sensing region SA. Word line selection signal lines PX, main word lines NWL, and control signal lines CON are disposed on the memory cell array 10. The control signal line CON may be composed of an equalizer control signal line, an NMOS enable signal line, and a PMOS enable signal line.

In the memory cell array 10 of FIG. 1, blocks formed of the conjunction region CJ, the sub word line driver region SWD, the sensing region SA, and the sub memory cell array block SMCA are repeatedly arranged in rows and columns. A sense amplifier circuit including a bit-line equalizer, an NMOS sense amplifier, and a PMOS sense amplifier is disposed in the sensing region SA. Sub word line drivers are disposed in the sub word line driver region SWD. The conjunction region CJ includes a control signal generator for controlling the sub word line driver, and a drive signal driver for driving the bit-line equalizer and the sense amplifiers.

Functions of the blocks shown in FIG. 1 are as follows. The sub memory cell array block SMCA includes memory cells coupled between word lines and bit lines, and data is written to and read from the selected memory cell. The equalizer of the sensing region SA functions to precharge a bit line, and the sense amplifier of the sensing region SA functions to sense and amplify data of the bit line.

The sub word line driver of the sub word line driver region SWD selectively drives a word line by combining signals transferred through the word line selection signal line PX and the main word line NWL. The drive signal driver of the conjunction region CJ functions to activate the drive signal line by combining signals transferred through the control signal line CON.

While FIG. 1 shows an example in which the semiconductor memory device includes the sub word line driver region SWD accommodating the sub word line driver for driving a word line WL by combining signals transferred through the word line selection signal line PX and the main word line NWL, the sub word line driver region SWD may be replaced with a contact region where a word line is strapped with the main word line NWL. In this case, adjacent word lines are respectively strapped with the different main word lines NWL at different contact regions. Further, although not shown, the main word line NWL, the word line selection signal line PX, and the control signal line CON may be controlled by a row controller.

Figure 2:
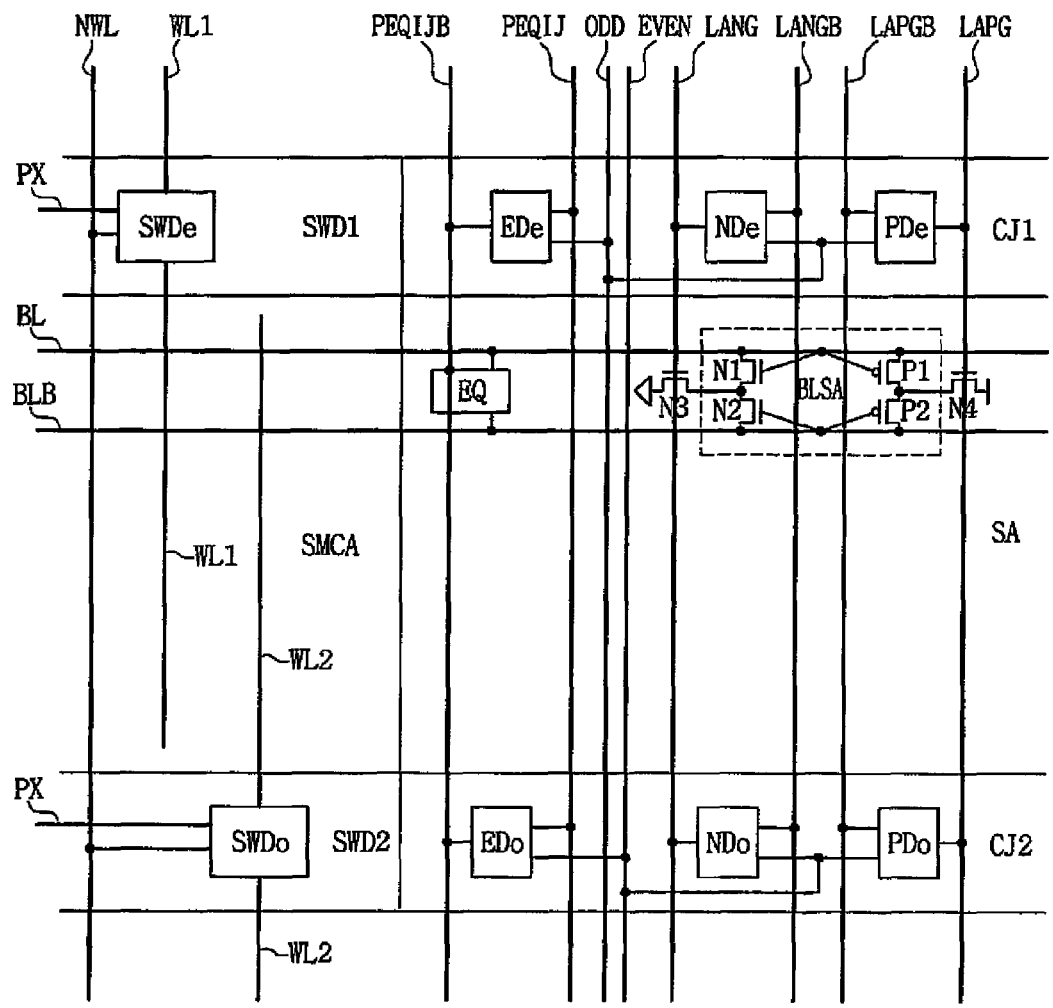
FIG. 2 is a diagram illustrating a detailed configuration of the semiconductor memory device according to an embodiment of the inventive concept.

FIG. 2 is a diagram illustrating a detailed configuration of the semiconductor memory device according to an embodiment of the inventive concept. In FIG. 2, SMCA, SWD1, SWD2, SA, CJ1, and CJ2 denote a sub memory cell array block, a first word line driver region, a second word line driver region, a sensing region, a first conjunction region, and a second conjunction region, respectively. The first word line driver region SWD1 is disposed at a side of the sub memory cell array block SMCA in the word line direction. The second word line driver region SWD2 is disposed at the other side of the sub memory cell array block SMCA in the word line direction. The sensing region SA is placed at a side of the sub memory cell array block SMCA in the bit line direction. The first conjunction region CJ1 is disposed at an intersection of the first word line driver region SWD1 and the sensing region SA, while the second conjunction region CJ2 is disposed at an intersection of the second word line driver region SWD2 and the sensing region SA.

Additionally, in FIG. 2, NWL denotes a main word line. WL1 and WL2 denote first and second word lines, respectively. BL denotes a bit line and BLB denotes an inverted bit line. PEQIJ denotes an equalizer control signal line, and PEQIJB denotes an equalizer drive signal line. LANGB denotes an NMOS enable signal line, and LANG denotes an NMOS drive signal line. LAPGB denotes a PMOS enable signal line, and LAPG denotes a PMOS drive signal line. ODD denotes a first row address information signal line, and EVEN denotes a second row address information signal line. The equalizer drive signal line PEQIJB, the NMOS drive signal line LANG, and the PMOS drive signal line LAPG may be formed of the same material (e.g., gate polycrystalline silicon) and with the same width as the first and second word lines WL1 and WL2.

An equalizer control signal activated with a high level for a predetermined period of time from a predetermined point is transferred through the equalizer control signal line PEQIJ. An NMOS enable signal activated with a low level for a predetermined period of time from a predetermined point is transferred through the NMOS enable signal line LANGB. A PMOS enable signal activated with a low level for a predetermined period of time from a predetermined point is transferred through the PMOS enable signal line LAPGB. A first row address information signal that is set to a first state (e.g., low level) when the lowest row address information (e.g., the least significant bit; LSB) is in the first state (e.g., low level, i.e., '0' in binary), or to a second state (e.g., high level) when the lowest row address information is in the second state (e.g., high level, i.e., '1' in binary), is transferred through the first row address information signal line ODD. A second row address information signal that is set to the second state (e.g., high level) when the lowest row address information is in the first state (e.g., low level, i.e., '0' in binary), and to the first state (e.g., low level) when the lowest row address information is in the second state (e.g., high level, i.e., '1' in binary), is transferred through the second row address information signal line EVEN.

As described above, the equalizer control signal, the NMOS enable signal, the PMOS enable signal, the first row address information signal, and the second row address information signal may be designed to be output from a row controller (not shown).

Meanwhile, in FIG. 2, SWDe denotes a first sub word line driver and SWDo denotes a second sub word line driver. EDe and EDo denote first and second equalizer drivers, respectively. NDe and NDo denote first and second NMOS sense amplifier drivers, respectively. PDe and PDo denote first and second PMOS sense amplifier drivers, respectively. EQ denotes an equalizer and BLSA denotes a sense amplifier.

Functional blocks of the semiconductor memory device according to an example embodiment shown in FIG. 2 will now be described in detail. The first sub word line driver SWDe is disposed in the first word line driver region SWD1 and selects and drives the first word line WL1 by combining signals transferred through the main word line NWL and the word line selection signal line PX. The second sub word line driver SWDo is disposed in the second word line driver region SWD2 and selects and drives the second word line WL2 by combining signals transferred through the main word line NWL and the word line selection signal line PX. A signal transferred through the word line selection signal line PX is determined by the lowest bit information (e.g., the least significant bit; LSB) of a row address. For instance, when the lowest row address information is in the first state (e.g., '0'), the first sub word line driver SWDe drives the first word line WL1. When the lowest row address information is in the second state (e.g., '1'), the second sub word line driver SWDo drives the second word line WL2.

The first equalizer driver EDe is disposed in the first conjunction region CJ1 and activates the equalizer drive signal line PEQIJB when the first sub word line driver SWDe enables the first word line WL1, in response to the equalizer control signal transferred through the equalizer control signal line PEQIJ and the first row address information signal transferred through the first row address information signal line ODD. The second equalizer driver EDo is disposed in the second conjunction region CJ2 and activates the equalizer drive signal line PEQIJB when the second sub word line driver SWDo enables the second word line WL2, in response to the equalizer control signal transferred through the equalizer control signal line PEQIJ and the second row address information signal transferred through the second row address information signal line EVEN. An output terminal of the first equalizer driver EDe is floated while the second sub word line driver SWDo activates the second word line WL2. An output terminal of the second equalizer driver EDo is floated while the first sub word line driver SWDe activates the first word line WL1.

The equalizer EQ is disposed in the sensing region SA and precharges the bit line BL and the inverted bit line BLB to a predetermined voltage in response to a signal (i.e., equalizer drive signal) transferred through the equalizer drive signal line PEQIJB.

The sense amplifier BLSA is disposed in the sensing region SA, driven by an NMOS transistor N3 turned on/off in response to a signal transferred through the NMOS drive signal line LANG and an NMOS transistor N4 turned on/off in response to a signal transferred through the PMOS drive signal line LAPG, and amplifies (or develops) voltages which appear on the bit line BL and the inverted bit line BLB according to data transferred through the bit line BL and the inverted bit line BLB. The sense amplifier BLSA may be composed of an NMOS sense amplifier including two NMOS transistors N1 and N2, and a PMOS sense amplifier including two PMOS transistors P1 and P2.

The first NMOS sense amplifier driver NDe is disposed in the first conjunction region CJ1 and activates the NMOS drive signal line LANG when the first sub word line driver SWDe enables the first word line WL1, in response to the NMOS enable signal transferred through the NMOS enable signal line LANGB and the first row address information signal transferred through the first row address information signal line ODD. The second NMOS sense amplifier driver NDo is disposed in the second conjunction region CJ2 and activates the NMOS drive signal line LANG when the second sub word line driver SWDo enables the second word line WL2, in response to the NMOS enable signal transferred through the NMOS enable signal line LANGB and the second row address information signal transferred through the second row address information signal line EVEN. An output terminal of the first NMOS sense amplifier driver NDe is floated while the second sub word line driver SWDo activates the second word line WL2. An output terminal of the second NMOS sense amplifier driver NDo is floated while the first sub word line driver SWDe activates the first word line WL1.

The NMOS transistor N3 and the NMOS sense amplifier formed of the NMOS transistors N1 and N2 are disposed in the sensing region SA. The NMOS transistor N3 is connected between the ground voltage and the NMOS sense amplifier formed of the two NMOS transistors N1 and N2, and is turned on/off in response to a signal transferred through the NMOS drive signal line LANG. The NMOS sense amplifier formed of the NMOS transistors N1 and N2 is driven by the NMOS transistor N3 and amplifies one of the bit line BL and the inverted bit line BLB to the ground voltage according to data transferred through the bit line BL and the inverted bit line BLB.

In the meantime, the first PMOS sense amplifier driver PDe is disposed in the first conjunction region CJ1 and activates the PMOS drive signal line LAPG when the first sub word line driver SWDe enables the first word line WL1, in response to the PMOS enable signal transferred through the PMOS enable signal line LAPGB and the first row address information signal transferred through the first row address information signal line ODD. The second PMOS sense amplifier driver PDo is disposed in the second conjunction region CJ2 and activates the PMOS drive signal line LAPG when the second sub word line driver SWDo enables the second word line WL2, in response to the PMOS enable signal transferred through the PMOS enable signal line LAPGB and the second row address information signal transferred through the second row address information signal line EVEN. An output terminal of the first PMOS sense amplifier driver PDe is floated while the second sub word line driver SWDo activates the second word line WL2. An output terminal of the second PMOS sense amplifier driver PDo is floated while the first sub word line driver SWDe activates the first word line WL1.

The NMOS transistor N4 and the PMOS sense amplifier formed of the PMOS transistors P1 and P2 are disposed in the sensing region SA. The NMOS transistor N4 is connected between a power source voltage and the PMOS sense amplifier formed of the two PMOS transistors P1 and P2, and is turned on/off in response to a signal transferred through the PMOS drive signal line LAPG. The PMOS sense amplifier formed of the PMOS transistors P1 and P2 is driven by the NMOS transistor N4 and amplifies one of the bit line BL and the inverted bit line BLB to the power source voltage according to data transferred through the bit line BL and the inverted bit line BLB.

According to the example embodiment of a semiconductor memory device shown in FIG. 2, the first equalizer driver EDe, the first NMOS sense amplifier driver NDe, and the first PMOS sense amplifier driver PDe may be disposed in the same column as the first sub word line driver SWDe and may activate the equalizer drive signal line PEQIJB, the NMOS drive signal line LANG, and the PMOS drive signal line LAPG, respectively, when the first sub word line driver SWDe drives the first word line WL1, and may be configured to float their output terminals when the first sub word line driver SWDe does not drive the first word line WL1. The second equalizer driver EDo, the second NMOS sense amplifier driver NDo, and the second PMOS sense amplifier driver PDo may be disposed in the same column as the second sub word line driver SWDo and may activate the equalizer drive signal line PEQIJB, the NMOS drive signal line LANG, and the PMOS drive signal line LAPG, respectively, when the second sub word line driver SWDo drives the second word line WL2, and may be configured to float their output terminals when the second sub word line driver SWDo does not drive the second word line WL2.

Figure 3:
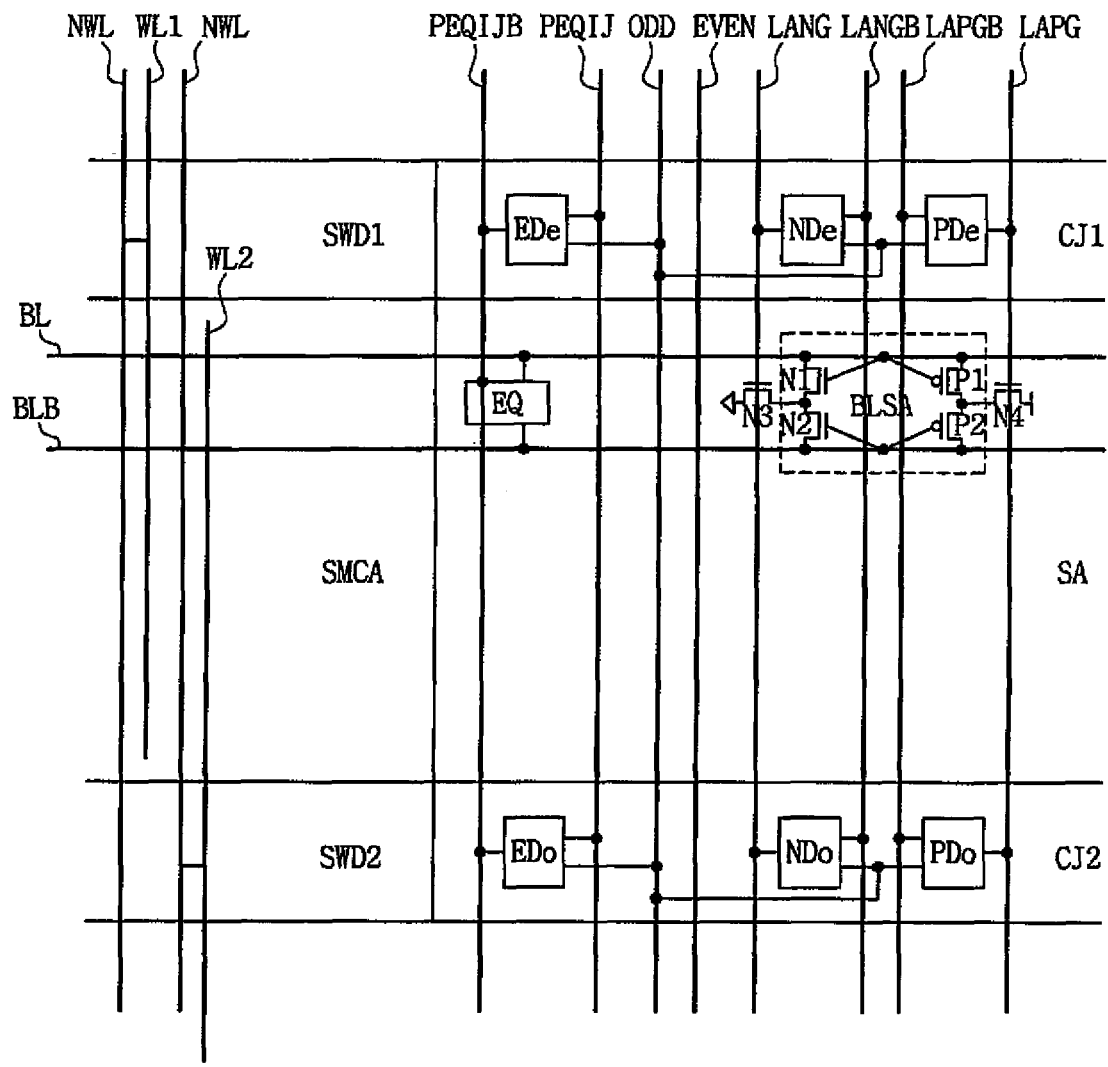
FIG. 3 is a diagram illustrating a detailed configuration of a semiconductor memory device according to another embodiment of the inventive concept.

FIG. 3 is a diagram illustrating a detailed configuration of a semiconductor memory device according to another embodiment of the inventive concept. The configuration of FIG. 3 is similar to that of FIG. 2, except that the first word line WL1 is strapped with the main word line NWL in the first word line driver SWD1 instead of disposing the first sub word line driver SWDe in the first word line driver SWD1, and the second word line WL2 is strapped with the main word line NWL in the second word line driver SWD2 instead of disposing the second sub word line driver SWDo in the second word line driver SWD2.

Operation of the semiconductor memory device shown in FIG. 3 will now be described.

In the first word line driver region SWD1, the first word line WL1 is strapped with the main word line NWL corresponding to a row address where the lowest row address information (e.g., the least significant bit; LSB) is set to the first state (e.g., low level, i.e., '0'). In the second word line driver region SWD2, the second word line WL2 is strapped with the main word line NWL corresponding to a row address where the lowest row address information (e.g., the least significant bit; LSB) is set to the second state (e.g., high level, i.e., '1'). In other words, the first word line WL1 is activated when the lowest row address information is in the first state (e.g., '0'), and the second word line WL2 is activated when the lowest row address information is in the second state (e.g., '1').

Structural and operational features of the first and second conjunction regions CJ1 and CJ2 and the sensing region SA are the same as described above with reference to FIG. 2. That is, they may be configured such that if the lowest address information is set to the first state (e.g., '0'), the first equalizer driver EDe, the first NMOS sense amplifier driver NDe, and the first PMOS sense amplifier driver PDe activate the equalizer driver line signal PEQIJB, the NMOS drive signal line LANG, and the PMOS drive-line signal LAPG, respectively. And if the lowest address information is set to the second state (e.g., '1'), the second equalizer driver EDo, the second NMOS sense amplifier driver NDo, and the second PMOS sense amplifier driver PDo activate the equalizer driver-line signal PEQIJB, the NMOS drive signal line LANG, and the PMOS drive-line signal LAPG, respectively.

Figure 4A:
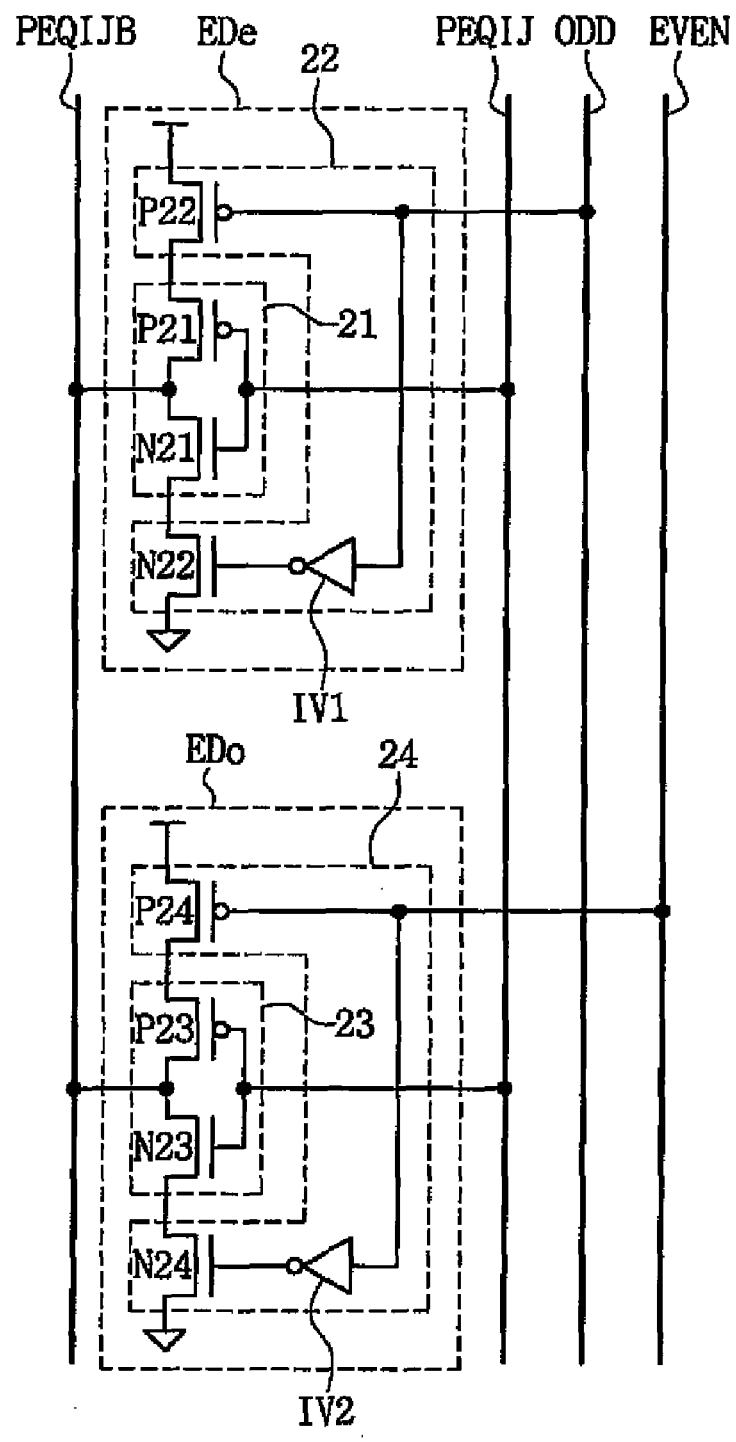
FIGS. 4A and 4B are circuit diagrams illustrating equalizer drivers and NMOS sense amplifier drivers of the semiconductor memory device shown in FIGS. 2 and 3 according to an embodiment of the inventive concept.
Figure 4B:
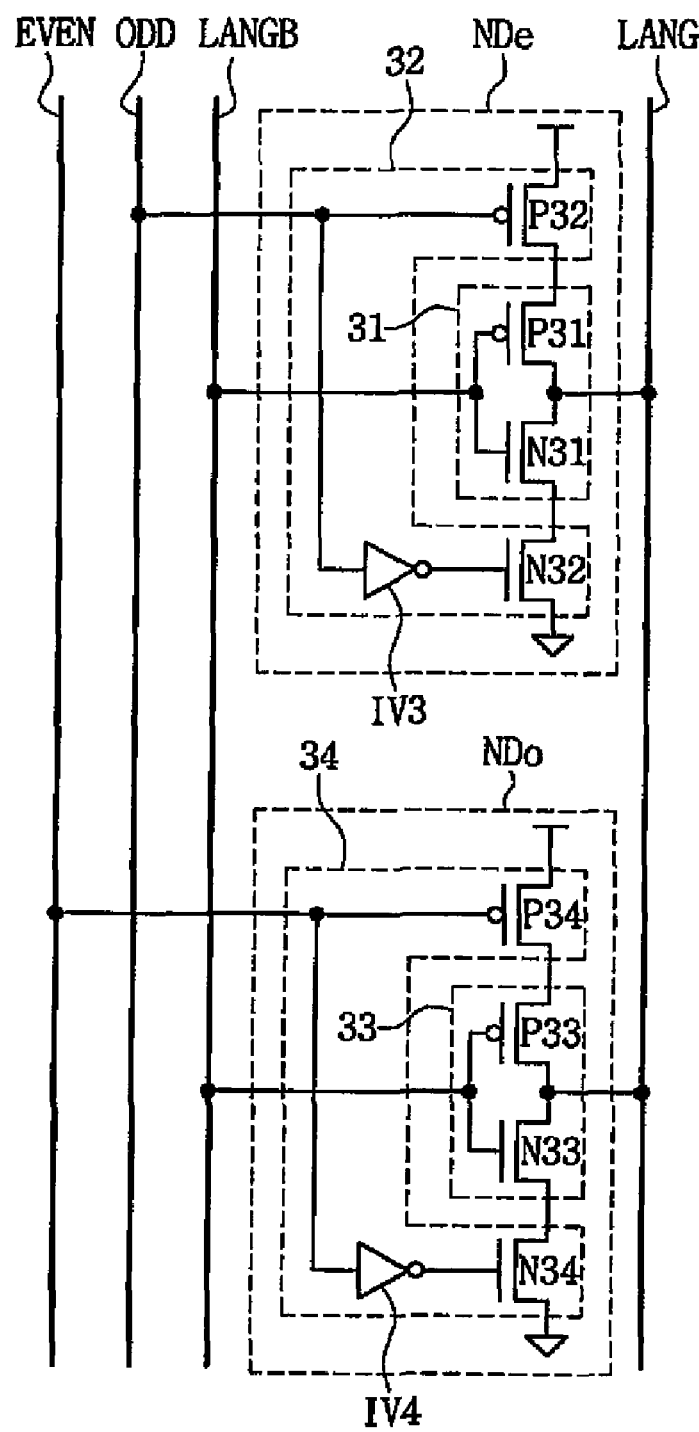

FIGS. 4A and 4B are circuit diagrams illustrating the first and second equalizer drivers, EDe and EDo, and the first and second NMOS sense amplifier drivers, NDe and NDo, of the semiconductor memory device shown in FIGS. 2 and 3 according to embodiments of the inventive concept. FIG. 4A shows the first and second equalizer drivers EDe and EDo, while FIG. 4B shows the first and second NMOS sense amplifier drivers NDe and NDo. The first and second PMOS sense amplifier drivers PDe and PDo may be configured to have the same circuit structure as the first and second NMOS sense amplifier drivers NDe and NDo shown in FIG. 4B.

The blocks shown in FIGS. 4A and 4B may operate as follows. First, referring to FIG. 4A, the first and second equalizer drivers EDe and EDo activate the equalizer drive signal line PEQIJB in response to the first or second row address information signal transferred through the first or second row address information signal lines ODD or EVEN and the equalizer control signal transferred through the equalizer control signal line PEQIJ.

The first equalizer driver EDe is composed of a first drive circuit 21 and a first switch circuit 22. The first drive circuit 21 includes PMOS and NMOS transistors P21 and N21, is connected between the equalizer control signal line PEQIJ and the equalizer drive signal line PEQIJB, and inverts the equalizer control signal transferred through the equalizer control signal line PEQIJ to activate the equalizer drive signal line PEQIJB. The first switch circuit 22 is connected between the first drive circuit 21, the power source voltage, and the ground voltage, and is switched on/off in response to the first row address information signal transferred through the first row address information signal line ODD.

The second equalizer driver EDo is composed of a second drive circuit 23 and a second switch circuit 24. The second drive circuit 23 includes PMOS and NMOS transistors P21 and N21, is connected between the equalizer control signal line PEQIJ and the equalizer drive signal line PEQIJ, and inverts the equalizer control signal transferred through the equalizer control signal line PEQIJ to activate the equalizer drive signal line PEQIJB. The second switch circuit 24 is connected between the second drive circuit 23, the power source voltage, and the ground voltage, and is switched on/off in response to the second row address information signal transferred through the second row address information signal line EVEN.

As described above, when the lowest row address information is in the first state (e.g., '0'), the first sub word line driver SWDe activates the first word line WL1 or the first word line WL1 is driven in the first word line driver region SWD1 by selecting the main word line NWL strapped therewith. Further, when the lowest row address information is in the first state (e.g., '0'), the first row address information signal is set to the first state (e.g., low level) and the second row address information signal is set to the second state (e.g., high level). Then, PMOS and NMOS transistors P22 and N22 constituting the first switch circuit 22 are all turned on to make the first equalizer driver EDe activate the equalizer drive signal line PEQIJB, while PMOS and NMOS transistors P24 and N24 constituting the second switch circuit 24 are all turned off to float the output terminal of the second equalizer driver EDo.

When the lowest row address information is in the second state (e.g., '1'), the second sub word line driver SWDe activates the second word line WL2, or the second word line WL2 is driven in the second word line driver region SWD2 by selecting the main word line NWL strapped therewith. Further, when the lowest row address information is in the second state (e.g., '1'), the first row address information signal is set to the second state (e.g., high level) and the second row address information signal is set to the first state (e.g., low level). Then, PMOS and NMOS transistors P22 and N22 constituting the first switch circuit 22 are all turned off to float the output terminal of the first equalizer driver EDe. While PMOS and NMOS transistors P24 and N24 constituting the second switch circuit 24 are all turned on to make the second equalizer driver EDo activate the equalizer drive signal line PEQIJB.

Next, referring to FIG. 4B, the first and second sense amplifier drivers NDe and NDo activate the NMOS drive signal line LANG in response to the first or second row address information signal transferred through the first or second row address information signal lines ODD or EVEN and the NMOS enable signal transferred through the NMOS enable signal line LANGB.

The first NMOS sense amplifier driver NDe is composed of a first drive circuit 31 and a first switch circuit 32. The first drive circuit 31 includes PMOS and NMOS transistors P31 and N31, is connected between the NMOS enable signal line LANGB and the NMOS drive signal line LANG, and inverts the NMOS enable signal transferred through the NMOS enable signal line LANGB to activate the NMOS drive signal line LANG. The first switch circuit 32 is connected between the first drive circuit 31, the power source voltage, and the ground voltage, and is switched on/off in response to the first row address information signal transferred through the first row address information signal line ODD.

The second NMOS sense amplifier driver NDo is composed of a second drive circuit 33 and a second switch circuit 34. The second drive circuit 33 includes PMOS and NMOS transistors P33 and N33, is connected between the NMOS enable signal line LANGB and the NMOS drive signal line LANG, and inverts the NMOS enable signal transferred through the NMOS enable signal line LANGB to activate the NMOS drive signal line LANG. The second switch circuit 34 is connected between the second drive circuit 33, the power source voltage, and the ground voltage, and is switched on/off in response to the second row address information signal transferred through the second row address information signal line EVEN.

The first and second NMOS sense amplifier drivers NDe and NDo shown in FIG. 4B operate similarly to the first and second equalizer drivers EDe and EDo shown in FIG. 4A.

For instance, when the lowest row address information is in the first state (e.g., '0'), the first word line WL1 is driven in the first word line driver region SWD1. Then, PMOS and NMOS transistors P32 and N32 constituting the first switch circuit 32 are all turned on to make the first NMOS sense amplifier driver NDe activate the NMOS drive signal line LANG, while PMOS and NMOS transistors P34 and N34 constituting the second switch circuit 34 are all turned off to float the output terminal of the second NMOS sense amplifier driver NDo.

When the lowest row address information is in the second state (e.g., '1'), the second word line WL2 is driven in the second word line driver region SWD2. Then, the PMOS and NMOS transistors P32 and N32 constituting the first switch circuit 32 are all turned off to float the output terminal of the first NMOS sense amplifier driver NDe, while the PMOS and NMOS transistors P34 and N34 constituting the second switch circuit 34 are all turned on to make the second NMOS sense amplifier driver NDo activate the NMOS drive signal line LANG.

The embodiments of the inventive concept are able to improve operational performance of a semiconductor memory device by driving word lines and drive signal lines in the same direction.

Although a few example embodiments have been described, those skilled in the art will readily appreciate that many modifications are possible in example embodiments without materially departing from the novel teachings and advantages. Accordingly, all such modifications are intended to be included within the scope of the inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and the inventive concept is not to be construed as limited to the specific embodiments disclosed, and that modifications to the disclosed embodiments, as well as other embodiments, are intended to be included within the scope of the appended claims.

What is claimed is:

1. A semiconductor memory device comprising:
a sub memory cell array block having memory cells connected between first and second word lines extending in a first direction and bit lines extending in a second direction perpendicular to the first direction;
a first word line driver region disposed at a side of the sub memory cell array block in the first direction, and configured to drive the first word lines;
a second word line driver region disposed at another side of the sub memory cell array block in the first direction, and configured to drive the second word lines;
a sensing region disposed at a side of the sub memory cell array block in the second direction, and configured to control the bit lines in response to signals transferred through drive signal lines;
a first conjunction region disposed at an intersection of the first word line driver region and the sensing region, and including a first drive signal driver configured to drive the drive signal lines in response to signals transferred through control signal lines when the first word line driver region drives the first word lines; and
a second conjunction region disposed at an intersection of the second word line driver region and the sensing region, and including a second drive signal driver configured to drive the drive signal lines in response to signals transferred through the control signal lines when the second word line driver region drives the second word lines.

2. The semiconductor memory device according to claim 1, wherein the sensing region comprises an equalizer configured to precharge the bit lines in response to the signals transferred through the drive signal lines.

3. The semiconductor memory device according to claim 2, wherein the control signal lines comprise:

an equalizer control signal line through which an equalizer control signal is transferred;
a first row address information signal line through which a first row address information signal is transferred, the first row address information signal is set to a second state when a lowest row address information is in a first state and is set to the first state when the lowest row address information is in the second state; and
a second row address information signal line through which a second row address information signal is transferred, the second row address information signal is set to the first state when the lowest row address information is in the first state and is set to the second state when the lowest row address information is in the second state,
wherein the first drive signal driver includes a first drive circuit connected between the equalizer control signal line and a corresponding one of the drive signal lines, and configured to invert the equalizer control signal and output an inverted equalizer control signal; and a first switch circuit connected to the first drive circuit, a power source voltage, and a ground voltage, and switched on/off in response to the first row address information signal, and
wherein the second drive signal driver includes a second drive circuit connected between the equalizer control signal line and the corresponding one of the drive signal lines, and configured to invert the equalizer control signal and output an inverted equalizer control signal; and a second switch circuit connected to the second drive circuit, the power source voltage, and the ground voltage, and switched on/off in response to the second row address information signal.

4. The semiconductor memory device according to claim 1, wherein the sensing region comprises:
an NMOS drive circuit connected to a ground voltage and turned on/off in response to a signal transferred through a corresponding one of the drive signal lines; and
an NMOS sense amplifier connected to the NMOS drive circuit and configured to amplify a voltage of corresponding ones of the bit lines to a level of the ground voltage according to data transferred through the corresponding ones of the bit lines.

5. The semiconductor memory device according to claim 4, wherein the control signal lines comprise:
an NMOS enable signal line through which an NMOS enable signal is transferred;
a first row address information signal line through which a first row address information signal is transferred, the first row address information signal is set to a second state when a lowest row address information is in a first state and is set to the first state when the lowest row address information is in the second state; and
a second row address information signal line through which a second row address information signal is transferred, the second row address information signal is set to the first state when the lowest row address information is in the first state and is set to the second state when the lowest row address information is in the second state,
wherein the first drive signal driver includes a first drive circuit connected between the NMOS enable signal line and a corresponding one of the drive signal lines, and configured to invert the NMOS enable signal and output an inverted NMOS enable signal; and a first switch circuit connected to the first drive circuit, a power source voltage, and the ground voltage, and switched on/off in response to the first row address information signal, and wherein the second drive signal driver includes a second drive circuit connected between the NMOS enable signal line and the corresponding one of the drive signal lines, and configured to invert the NMOS enable signal and output the inverted NMOS enable signal; and a second switch circuit connected to the second drive circuit, the power source voltage, and the ground voltage, and switched on/off in response to the second row address information signal.

6. The semiconductor memory device according to claim 1, wherein the sensing region comprises:
a PMOS drive circuit connected to a power source voltage and turned on/off in response to a signal transferred through a corresponding one of the drive signal lines; and
a PMOS sense amplifier connected to the PMOS drive circuit and configured to amplify a voltage of corresponding ones of the bit lines to a level of the power source voltage according to data transferred through the corresponding ones of the bit lines.

7. The semiconductor memory device according to claim 6, wherein the control signal lines comprise:
a PMOS enable signal line through which a PMOS enable signal is transferred;
a first row address information signal line through which a first row address information signal is transferred, the first row address information signal is set to a second state when a lowest row address information is in a first state and is set to the first state when the lowest row address information is in the second state; and
a second row address information signal line through which a second row address information signal is transferred, the second row address information signal is set to the first state when the lowest row address information is in the first state and is set to the second state when the lowest row address information is in the second state,
wherein the first drive signal driver includes a first drive circuit connected between the PMOS enable signal line and a corresponding one of the drive signal lines, and configured to invert the PMOS enable signal and output an inverted PMOS enable signal; and a first switch circuit connected to the first drive circuit, the power source voltage, and a ground voltage, and switched on/off in response to the first row address information signal, and
wherein the second drive signal driver includes a second drive circuit connected between the PMOS enable signal line and the corresponding one of the drive signal lines, and configured to invert the PMOS enable signal and output the inverted PMOS enable signal; and a second switch circuit connected to the second drive circuit, the power source voltage, and the ground voltage, and switched on/off in response to the second row address information signal.

8. The semiconductor memory device according to claim 1, wherein the drive signal lines are a same material as the first and second word lines.

9. The semiconductor memory device according to claim 1, wherein in the first word line driver region, a corresponding one of the first word lines is strapped with a main word line corresponding to a row address with a lowest row address information that is in a first state, and in the second word line driver region, a corresponding one of the second word lines is strapped with another main word line corresponding to a row address with the lowest row address information that is in a second state.

10. The semiconductor memory device according to claim 1, wherein the first word line driver region comprises a first sub word line driver configured to drive a corresponding one of the first word lines in response to signals transferred through a main word line and a word line selection signal line when a lowest row address information is in a first state, and the second word line driver region comprises a second sub word line driver configured to drive a corresponding one of the second word lines in response to signals transferred through the main word line and another word line selection signal line when the lowest row address information is in a second state.

11. A semiconductor memory device comprising:
a sub memory cell array block having memory cells connected between first and second word lines extending in a first direction and bit lines extending in a second direction perpendicular to the first direction;
a first word line driver region disposed at a side of the sub memory cell array block in the first direction, and configured to drive the first word lines;
a second word line driver region disposed at another side of the sub memory cell array block in the first direction, and configured to drive the second word lines;
a sensing region disposed at a side of the sub memory cell array block in the second direction, and configured to precharge the bit lines and to sense and amplify data on the bit lines in response to drive signals transferred through drive signal lines;
a first conjunction region disposed at an intersection of the first word line driver region and the sensing region, and including a first drive signal driver configured to drive the drive signal lines in response to signals transferred through control signal lines and address signal lines when the first word line driver region drives the first word lines; and
a second conjunction region disposed at an intersection of the second word line driver region and the sensing region, and including a second drive signal driver configured to drive the drive signal lines in response to signals transferred through the control signal lines and the address signal lines when the second word line driver region drives the second word lines,
wherein the drive signal lines, the control signal lines and the address signal lines extend in the first direction.

12. The semiconductor memory device according to claim 11, wherein the sensing region comprises:
an equalizer that precharges the bit lines responsive to an equalization drive signal transferred through the drive signal lines;
an NMOS sense amplifier that senses and amplifies the data on the bit lines responsive to an NMOS drive signal transferred through the drive signal lines; and
a PMOS sense amplifier that senses and amplifies the data on the bit lines responsive to a PMOS drive signal transferred through the drive signal lines.

13. The semiconductor memory device according to claim 12, wherein the first and second conjunction regions each respectively comprise:
an equalizer driver that outputs the equalization drive signal responsive to address signals transferred through the address signal lines and an equalizer control signal transferred through the control signal lines;
an NMOS driver that outputs the NMOS drive signal responsive to the address signals transferred through the address signal lines and an NMOS enable signal transferred through the control signal lines; and
a PMOS driver that outputs the PMOS drive signal responsive to the address signals transferred through the address signal lines and a PMOS enable signal transferred through the control signal lines.

* * * * *